(12) United States Patent
Takahashi

(10) Patent No.: US 6,355,385 B1
(45) Date of Patent: Mar. 12, 2002

(54) METHODS FOR MAKING RETICLE BLANKS, AND FOR MAKING RETICLES THEREFROM, FOR CHARGED-PARTICLE-BEAM MICROLITHOGRAPHY

(75) Inventor: Shin-ichi Takahashi, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/574,279

(22) Filed: May 19, 2000

(30) Foreign Application Priority Data

May 19, 1999 (JP) .......................................... 11-138083

(51) Int. Cl.$^7$ .............................. G03F 9/00; G21K 5/00
(52) U.S. Cl. ............................................. 430/5; 378/35
(58) Field of Search ..................... 430/5, 296; 378/34, 378/35; 250/492.22

(56) References Cited

U.S. PATENT DOCUMENTS 5,928,816 A * 7/1999 Lee et al. ...................... 430/5

* cited by examiner

Primary Examiner—S. Rosasco
(74) Attorney, Agent, or Firm—Klarquist Sparkman LLP

(57) ABSTRACT

Methods are disclosed for manufacturing reticle blanks, and reticles therefrom, for use in charged-particle-beam microlithography. The subject reticles exhibit substantially less tensile stress and thus substantially less pattern distortion, than conventional reticles. In a representative method, a silicon substrate is provided that includes an active silicon layer and a silicon support portion. At least on the silicon support portion, a wet-etching mask is formed that defines a prescribed pattern of openings corresponding to a desired pattern of windows. The silicon support portion, exposed in the openings, is wet etched depthwise toward the active silicon layer. After completing etching, a protective film of an oxygen-impermeable material is formed over the wet-etched product. The product is annealed, followed by removal of the protective film.

20 Claims, 7 Drawing Sheets

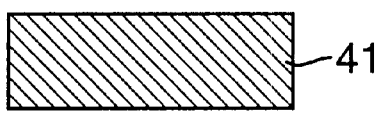
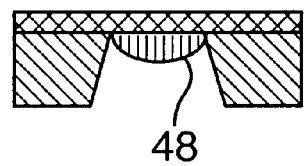
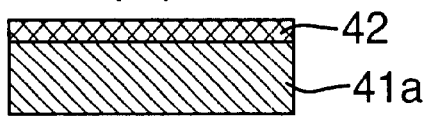
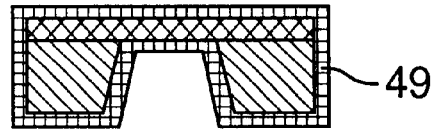
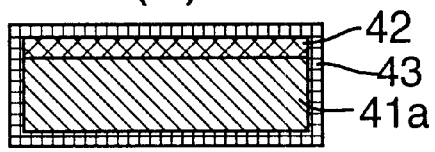
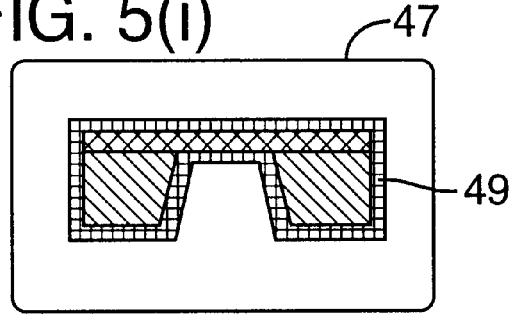
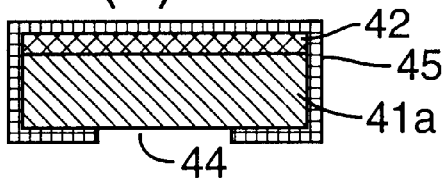
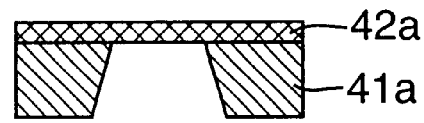
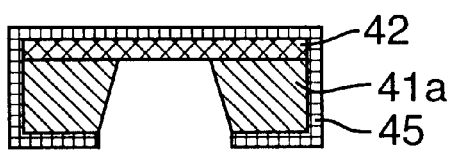
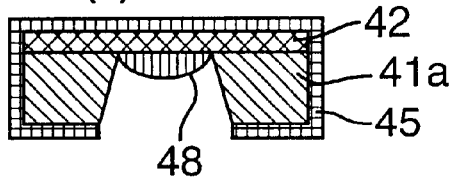

METHODS FOR MAKING RETICLE BLANKS, AND FOR MAKING RETICLES THEREFROM, FOR CHARGED-PARTICLE-BEAM MICROLITHOGRAPHY

FIELD OF THE INVENTION

This invention relates to microlithography as performed using a charged particle beam (e.g., electron beam or ion beam) as used in the manufacture of semiconductor integrated circuits, displays, and the like. More specifically, the invention pertains to reticle "blanks" as used to make pattern-defining reticles for use in such microlithography, and to methods for manufacturing such reticle blanks.

BACKGROUND OF THE INVENTION

The dramatic progressive reduction in the sizes of circuit elements in integrated circuits that has occurred in recent years has created a need for image resolution better than that obtainable using optical microlithography systems that are limited by the diffraction of light. This has led to the ongoing development of microlithography (projection-exposure) systems that, instead of using light, employ an X-ray beam or a charged particle beam such as electron beam or an ion beam.

Current charged-particle-beam (CPB) systems include electron-beam pattern-drawing ("direct-write") systems in which an electron beam is used to form a pattern directly (i.e., without having to project a pattern onto the wafer). Because of the current ability to stop an electron beam down to a spot diameter of a few Ångstroms, high-resolution sub-micron patterns can be formed in this way. A major drawback of direct-write systems is the fact that the pattern is drawn element-by-element and line-by-line (i.e., by "direct writing"). To draw a finer element, the electron beam simply is stopped down further to a smaller spot diameter. However, reducing the spot diameter increases the amount of time ("writing time") that must be expended to draw the entire pattern. Increasing the writing time correspondingly reduces throughput and increases device-production costs. Consequently, direct-write systems are impractical for mass production of chip-containing wafers.

The shortcomings of direct-write systems has motivated a large amount of development effort currently being directed to the development of a practical CPB microlithography system that projects (with demagnification) a pattern image from a "reticle" or "mask" to the wafer. Such systems are termed "reduced-image projection-exposure" CPB microlithography systems, in which a reticle defining the prescribed pattern is illuminated by a charged particle beam (e.g., electron beam), and a reduced (demagnified) image of the pattern located within the range of illumination is transferred onto the wafer by a projection lens.

By "demagnification" is meant that the image as formed on the wafer is smaller (usually by an integer factor such as ¼ or ⅕) than the corresponding illuminated region on the reticle.

As noted above, the pattern is defined on a "reticle" (sometimes termed a "mask," but generally herein the term "reticle" is used). Two general types of reticles are known. A first type is termed a "scattering-membrane" reticle 21, a portion of which is shown schematically in FIG. 7(a). The scattering-membrane reticle comprises a reticle membrane 22 on which regions 24 are formed. The regions 24 are of a substance that scatters particles of a charged particle beam incident from above. The reticle membrane 22 is sufficiently thin to be transmissive to particles of the incident beam and thus exhibit essentially no scattering. The regions 24, in combination with the transmissive membrane 22, define the elements of the pattern. A second type of reticle is termed a "scattering-stencil" reticle 31, a portion of which is shown schematically in FIG. 7(b). The scattering-stencil reticle comprises a reticle membrane 32 (typically made of silicon) having a thickness (approximately 2 $\mu$m) sufficient to scatter particles of the incident beam. The membrane 32 defines through-holes 34 that are transmissive to particles of the incident beam. The through-holes 34, in combination with the membrane 34, define the elements of the pattern.

In CPB microlithography, it currently is impossible to project an entire pattern in one "shot." As a result, the pattern as defined on the reticle is divided or "segmented" into multiple small portions termed "subfields" 22a, 32a each defining a respective portion of the overall pattern and each containing a respective portion of the reticle membrane 22, 32. The subfields 22a, 32a are separated from one another on the reticle by boundary zones (e.g., item 25 in FIG. 7(a)) that do not define any portion of the pattern. Extending outwardly from the boundary zones 25 are support struts 23 that add substantial rigidity and strength to the reticle.

Each subfield 22a, 32a represents an area of the reticle that can be exposed at any one instant, and each subfield is typically approximately 1-mm square in size. Hence, on the reticle, the entire pattern to be transferred to a chip-sized area (a "die" corresponding to a semiconductor chip) on the wafer is divided into a large number of, typically, 1-mm square subfields. The subfields are exposed individually. As the subfields are thus "transferred" to the wafer, the respective images of the subfields are "stitched" together contiguously to form the entire pattern in each die.

As shown in FIG. 7(c), during pattern transfer, the subfields 22a, 32a are scanned in a stepwise manner by the charged particle beam to transfer, to a "sensitized" substrate ("wafer") 27, the respective pattern portions defined by the subfields. By "sensitized" is meant that the substrate 27 is coated with a material (termed a "resist") capable of being imprinted with the projected subfield images. FIG. 7(c) clearly shows the "reduction" or "demagnification" of the images that occurs during projection, and the "stitching together" of the subfield images on the substrate in a contiguous manner.

Reticles for CPB microlithography normally are manufactured from "reticle blanks" that include the reticle membrane and the supporting struts. The lattice-like arrangement of the support struts defines intervening spaces on the reticle membrane in which the various subfields will be formed. A conventional process for making a reticle blank that includes a silicon membrane is shown in FIGS. 6(a)–6(f).

In a first step (FIG. 6(a)), a silicon substrate having a (100) surface orientation is prepared, and boron is diffused (e.g., by thermal diffusion or ion implantation) into one major surface of the substrate to form an "active" silicon layer 12 (FIG. 6(b)). During a later etching step, the active silicon layer acts as an etch-stop layer. The active layer 12 is also destined to become the silicon membrane of a reticle formed from the blank, with the remainder of the silicon substrate 11 (i.e., everything except the active layer 12) being regarded as the silicon support portion 11a (FIG. 6(b)).

Next, a silicon nitride film 13 is formed over the entire outer surface of the silicon substrate 11 (FIG. 6(c)). A wet-etching mask 15 is formed by etching a pattern of "windows" (openings) 14 in the silicon nitride formed on the lower (in the figure) major surface of the substrate (FIG. 6(d)). Although only one window 14 is shown in the figure, normally a large number of such windows 14 are formed, corresponding to the number of subfields into which the reticle will be divided.

Next, the silicon substrate 11 (with etching mask 15) is immersed in an etching solution such as potassium hydroxide (KOH). The KOH solution wet-etches the silicon support portion 11a in the windows 14 not protected by silicon nitride. The etching solution removes silicon mainly in the depthwise direction. The etching rate drops abruptly when etching has reached the active silicon layer 12, thus stopping the depthwise etch (FIG. 6(e)).

If the boron concentration in the active silicon layer 12 is less than $2 \times 10^{19}$ atoms/cm$^3$, no significant drop in etch rate will occur, and etching will proceed through the active silicon layer 12. Hence, to serve as an effective etch-stop layer, the concentration of boron in the active silicon layer 12 must be at least about $2 \times 10^{19}$ atoms/cm$^3$.

In the last step, the silicon nitride etching mask 15 is removed to complete manufacture of the reticle blank (FIG. 6(f)).

The reticle blank shown in FIG. 6(f) comprises a silicon membrane 12b made of an active silicon layer diffused with boron, and silicon support struts 11b that provide support for the membrane 12b. To form a reticle from the reticle blank, a resist is applied to the membrane 12b of the reticle blank, and the prescribed pattern is written into the resist using an electron beam direct-write lithography system. The membrane 12b is then etched, with the patterned resist serving as the etching mask, to complete manufacture of a scattering-stencil reticle.

As described above, providing a diffused-boron concentration in the active silicon layer of at least approximately $2 \times 10^{19}$ atoms/cm$^3$ provides an effective etch-stopping layer. However, whenever the active silicon layer is used as a reticle membrane in a reticle formed from the reticle blank, the greater the amount by which the boron concentration exceeds $2 \times 10^{19}$ atoms/cm$^3$, the greater the tensile stress in the reticle membrane. High tensile stress in a silicon reticle membrane can cause distortion of a pattern from the reticle to a sensitive substrate. High tensile stress also can affect adversely the distribution of the boron concentration depthwise in the silicon membrane.

FIG. 8 shows a representative distribution of boron concentration depthwise in the silicon membrane of a conventional reticle blank. In FIG. 8, the ordinate (vertical axis) is boron concentration plotted on a logarithmic scale, and the abscissa (horizontal axis) is a depth dimension in the membrane plotted on a linear scale. On the abscissa, 0 µm corresponds to the upper (in the figure) major surface of the membrane (i.e., the surface into which the boron is diffused). Measurements of boron concentration were performed by SIMS (secondary ion mass spectrometry) analysis.

From FIG. 8 it can be seen that the boron concentration is greatest just below the upper surface, and increases and then decreases with increasing depth. The variance in boron concentration through the thickness dimension is approximately 30%, as calculated from the difference of the lowest boron concentration from the highest boron concentration divided by the mean boron concentration ($1.6 \times 10^{20}$ atoms/cm$^3$). Corresponding to the profile of boron concentration, tensile stress near the top surface of the membrane (where boron concentration is high) is higher than in locations deeper in the thickness dimension. Hence, whenever a pattern to be transferred to a sensitive substrate is formed in the membrane, the membrane tends to exhibit distortion of its top surface (where stress is greatest). Such distortion also appears in the pattern as projected from the reticle.

Along with the trend toward integrated circuits having increasingly smaller circuit elements, the accuracy requirements demanded of reticles used for X-ray or CPB microlithography are much stricter than required of reticles used with conventional optical microlithography. I.e., the patterning and positioning accuracy requirements for X-ray and CPB microlithography is on the order of a few tens of nanometers. Consequently, phenomena such as membrane distortion due to a non-uniform depthwise distribution of tensile stress caused by a corresponding non-uniform boron concentration, the associated high tensile stress, and the attendant pattern distortion are now serious problems.

SUMMARY OF THE INVENTION

In view of the shortcomings of the prior art as summarized above, an object of the invention is to provide methods for manufacturing reticle blanks having reduced tensile stress and that are not subject to distortion caused by excessive tensile stress.

To such end, and according to a first aspect of the invention, methods are provided for manufacturing a reticle blank. In one embodiment of such a method, a silicon substrate is provided that comprises an active silicon layer on a major surface of a silicon support portion. At least on the silicon support portion, a wet-etching mask is formed that defines a prescribed pattern of openings corresponding to a desired pattern of windows. (The pattern of windows typically corresponds to an anticipated pattern of reticle subfields separated from one another by struts formed from remaining substrate.) The silicon support portion exposed in the openings is then wet-etched depthwise toward the active silicon layer. A protective film of an oxygen-impermeable material (desirably silicon nitride) is formed over the product of the wet-etching step, followed by a thermal anneal. Finally, the protective film is removed. The wet-etching mask can be removed before or after removing the oxygen-impermeable material.

The active silicon desirably is doped with boron to a concentration of $2 \times 10^{19}$ to $5 \times 10^{20}$ atoms/cm$^3$ for optimal stress reduction while still allowing the active silicon layer to serve as an etching-stop layer. Further desirably, the concentration of boron through the thickness dimension has a variance of no greater than 1%.

The thermal annealing step desirably is performed at temperature range of 1000° C. to 1200° C. for a time ranging from 2 to 4 hours.

In another embodiment of a method according to the invention for forming a reticle blank, a silicon substrate is provided that comprises an active silicon layer on a major surface of a silicon support portion. At least on the silicon support portion, a wet-etching mask is formed that defines a prescribed pattern of openings corresponding to a desired pattern of windows. The silicon support portion exposed in the openings is wet-etched depthwise toward the active silicon layer to expose corresponding portions of the active silicon layer. A protective resist is applied to the exposed portions of the active silicon layer. The wet-etching mask is removed, followed by removal of the protective resist. A protective film of an oxygen-impermeable material is then formed over the entire product of the previous step, followed by thermal annealing. After annealing, the protective film is removed.

According to another aspect of the invention, methods are provided for manufacturing a reticle for charged-particle-beam microlithography. Typically, such a method comprises providing a reticle blank by a method as summarized above, followed by defining a pattern in or on the active silicon layer.

The invention also encompasses reticle blanks and reticles made according to a method as described herein.

The foregoing and additional features and advantages of the invention will be more readily apparent from the following detailed description, which proceeds with reference to the accompanying drawings.

BRIEF DESCRIPTION OF THE DRAWINGS

FIGS. 5(a)–5(j) schematically depict, in respective vertical sections, the results of certain steps in a reticle-blank manufacturing method according to a second representative embodiment of the invention.

DETAILED DESCRIPTION

Figure 1:
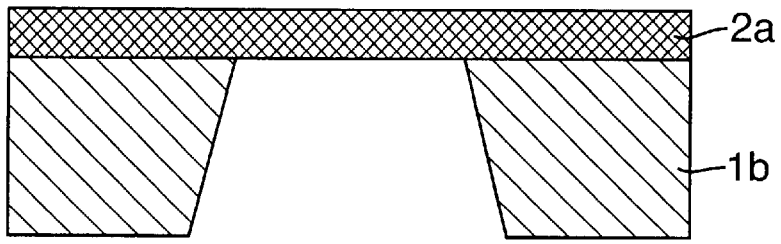
FIG. 1 is a schematic elevational section of a reticle blank produced using a method according to a representative embodiment of the invention.

The configuration of a representative embodiment of a reticle blank 1 according to the invention is shown in FIG. 1. The reticle blank 1 comprises a silicon membrane 2a formed from an active silicon layer containing diffused boron, and silicon struts 1b (members providing support for the membrane 2a). To provide the desired level of tensile stress, the preferred concentration of boron in the membrane 2a is $2 \times 10^{19}$ to $5 \times 10^{20}$ atoms/cm$^3$.

Figure 2:
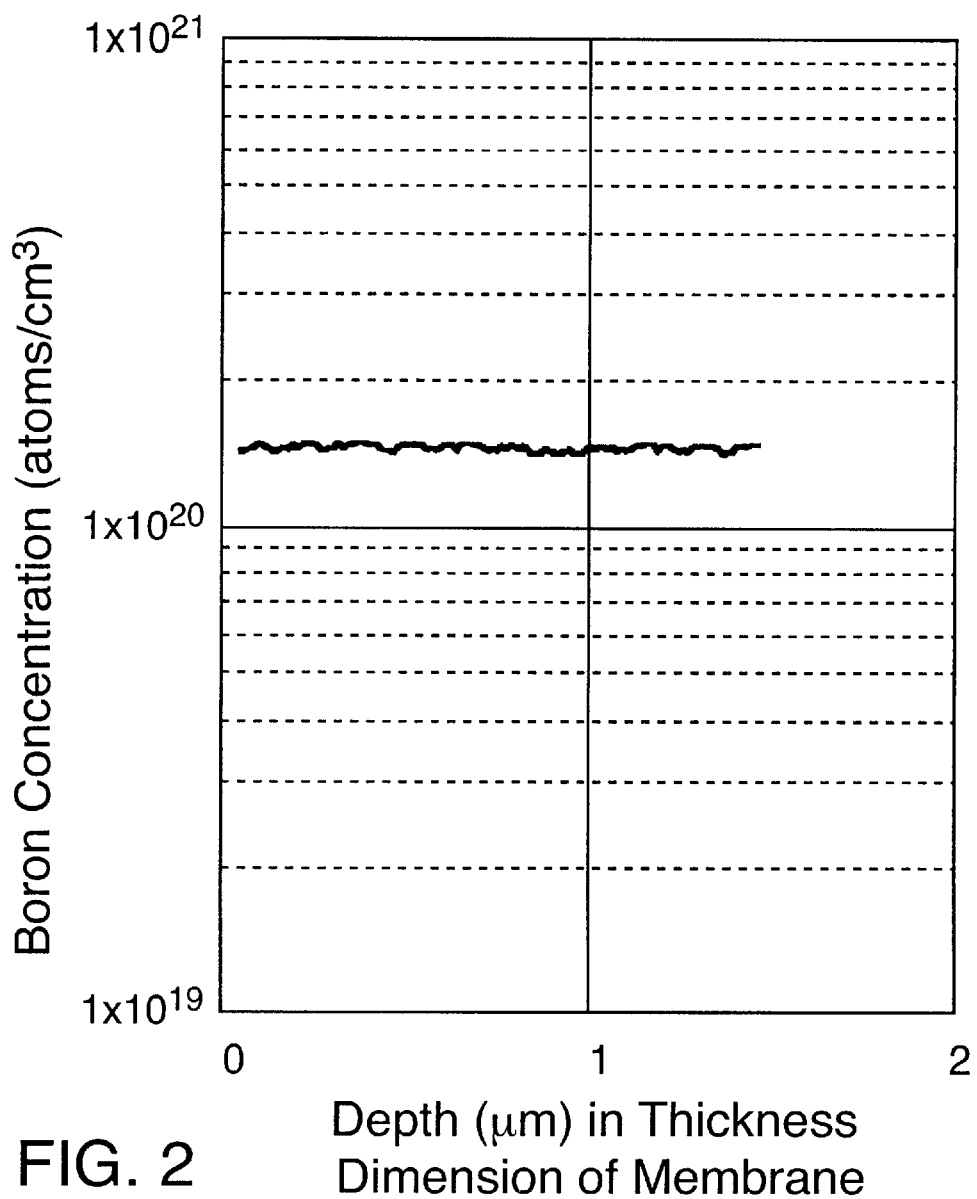
FIG. 2 is a graph of boron concentration, as a function of depth in the thickness dimension, in a membrane of a reticle blank fabricated using a method according to an embodiment of the invention.

FIG. 2 is an exemplary graph of depthwise boron concentration in the thickness dimension of the membrane of a reticle blank according to the invention. In FIG. 2, the Y-axis (ordinate) is boron concentration, and the X-axis (abscissa) is depth in the thickness dimension, with the membrane's outermost surface being at X=0. As can be seen in FIG. 2, depthwise boron concentration within the membrane in this example is substantially constant at $1.46 \times 10^{20}$ atoms/cm$^3$ through the thickness dimension, and the variation in the depthwise boron concentration is less than 1%. The tensile stress exhibited by such a membrane is substantially reduced, compared to a conventional reticle blank. Specifically, the local tensile strength exhibited by the FIG. 1 reticle blank is no more than approximately 10 MPa, yielding a local pattern distortion of no more than 10 nm. (It will be understood that the amount of local distortion actually exhibited by any reticle depends upon the actual configuration of the pattern defined by the reticle.)

After forming a pattern on the reticle blank 1, no subsequent distortion of the pattern was observed.

A first representative embodiment of a method, according to the invention, for manufacturing a reticle blank is described below, with reference to FIGS. 3(a)–3(h). FIGS. 3(a)–3(e) depict steps that are essentially the same as corresponding steps in a conventional method (see FIGS. 6(a)–6(e)). I.e., the methods are the same from the step of preparing the silicon substrate 31 through the formation of the membrane 32 and portions 31a of the silicon substrate 31 destined to form the support struts 31. The difference is in the subsequent steps.

Figure 3A:
FIGS. 3(a)–3(h) schematically depict, in respective vertical sections, the results of certain steps in a reticle-blank manufacturing method according to a first representative embodiment of the invention.
Figure 3B:
Figure 3C:
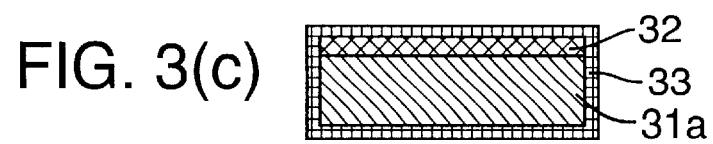
Figure 3D:
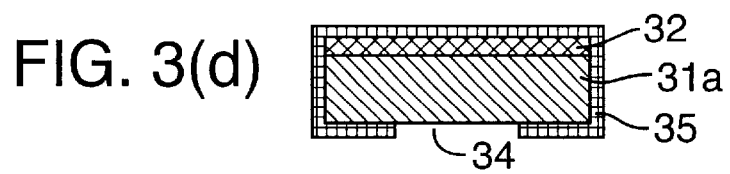
Figure 3E:
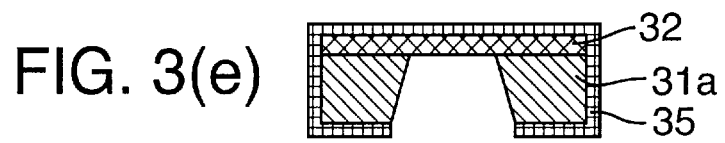
Figure 3F:
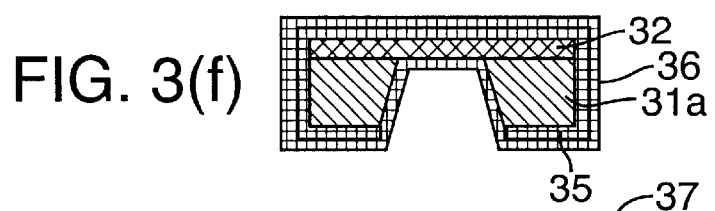

After performing the step shown in FIG. 3(e), an additional protective film 36 of an oxygen-impermeable material such as silicon nitride is formed over the entire surface (FIG. 3(f)). An annealing step is performed by placing the reticle blank in an annealing furnace 37 (FIG. 3(g)). Finally, the reticle blank is removed from the furnace and the protective film 35 is removed either by dry etching or by wet etching in hot phosphoric acid (FIG. 3(h)). The resulting reticle blank, shown in FIG. 3(h), includes a membrane 32a and support struts 31b.

For comparison purposes, a first sample reticle blank was prepared as described above with respect to FIGS. 3(a)–3(g). A second reticle blank was prepared by a method in which, following the steps indicated by FIGS. 3(a)–3(e), annealing was performed in an annealing furnace but without having first formed a protective film (e.g., silicon nitride) over the entire surface of the reticle blank.

For this example, annealing was performed at 1050° C. for three hours. Annealing times and temperatures can be changed, however, to obtain reticle blanks having preselected levels of stress. Generally, annealing is performed at a temperature ranging from 1000° C. to 1200° C. for 2 to 4 hours.

Figure 4:
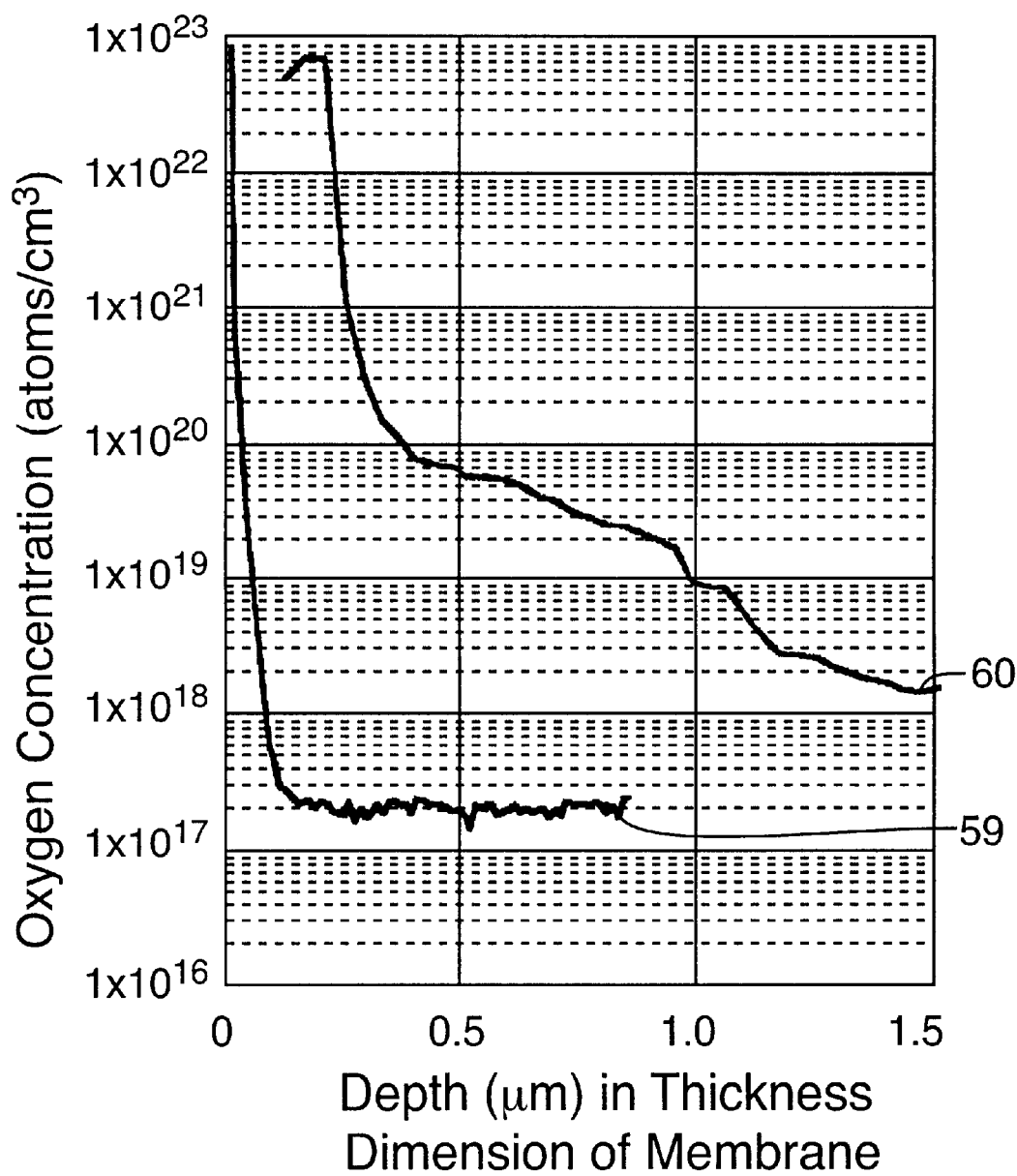
FIG. 4 is a graph of two plots. One plot (labeled "59") is of an exemplary distribution of oxygen concentration within the thickness dimension of a membrane of a reticle blank fabricated by a method, according to the invention, that includes thermally annealing the reticle blank while the reticle blank is coated with a protective silicon nitride (or other oxygen-impermeable) film. The other plot (labeled "60") is of an exemplary distribution of oxygen concentration within the thickness dimension of a membrane of a reticle blank fabricated by a method that includes thermally annealing the reticle blank but without first applying a protective oxygen-impermeable film to the reticle blank.
Figure 6A:
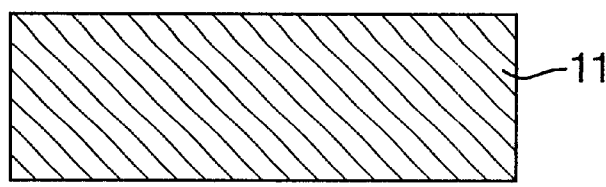
FIGS. 6(a)–6(f) schematically depict, in respective vertical sections, the results of certain steps in a conventional reticle-blank manufacturing method.
Figure 6B:
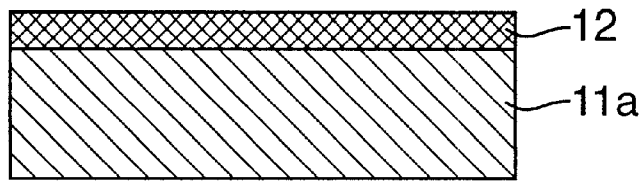
Figure 6C:
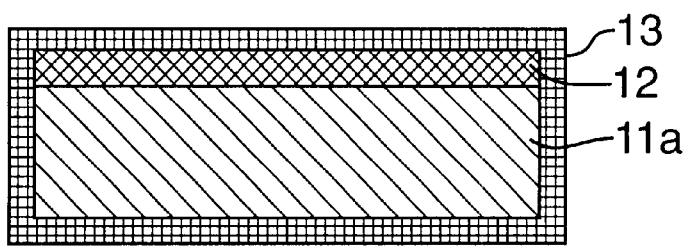
Figure 6D:
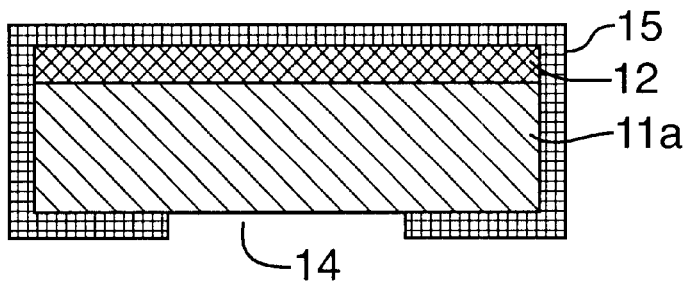
Figure 6E:
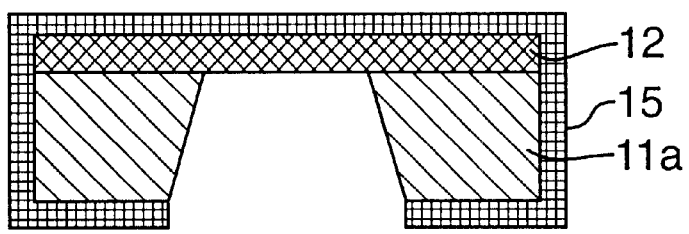
Figure 6F:
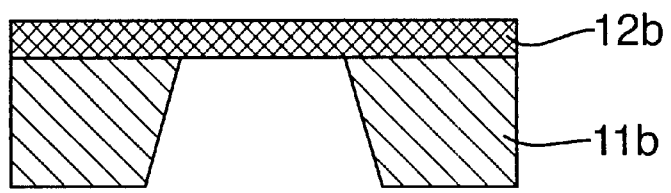
Figure 7A:
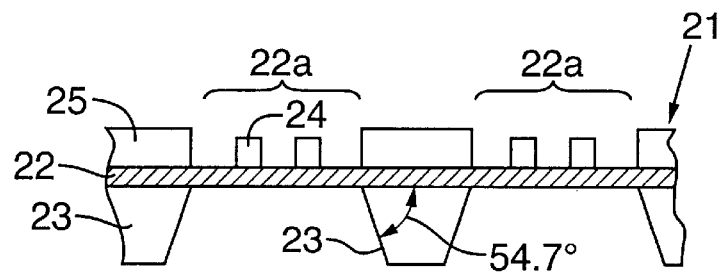
FIG. 7(a) schematically depicts, in a vertical section, certain details of a conventional scattering-membrane reticle as used in reduced-image CPB microlithography.
Figure 7B:
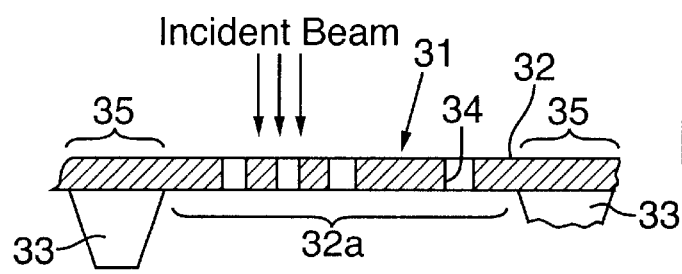
FIG. 7(b) schematically depicts, in a vertical section, certain details of a conventional scattering-stencil reticle as used in reduced-image CPB microlithography.
Figure 7C:
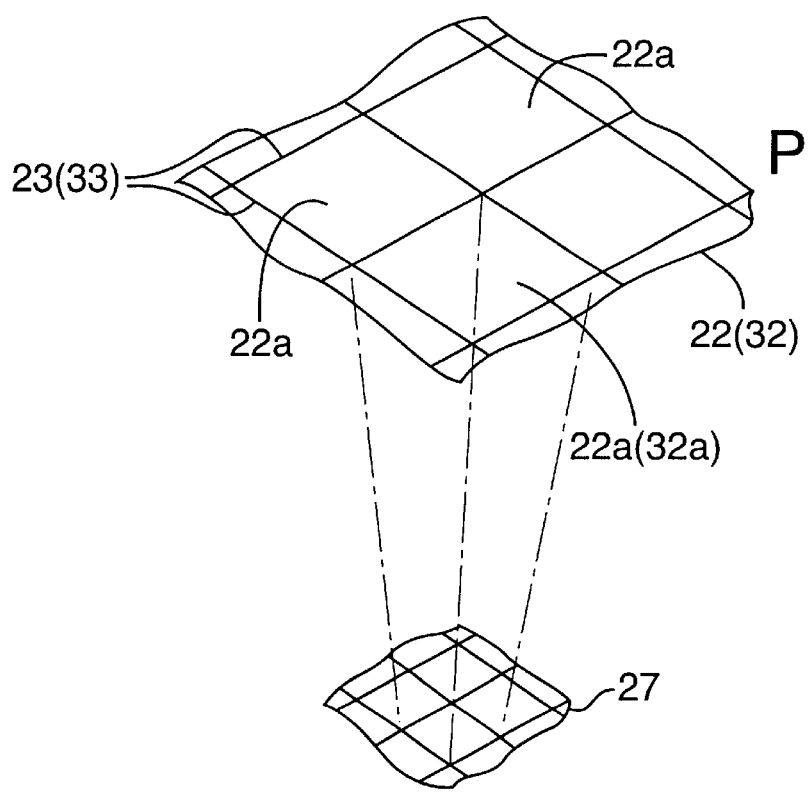
FIG. 7(c) shows certain imaging relationships of reduced-image CPB microlithography.
Figure 8:
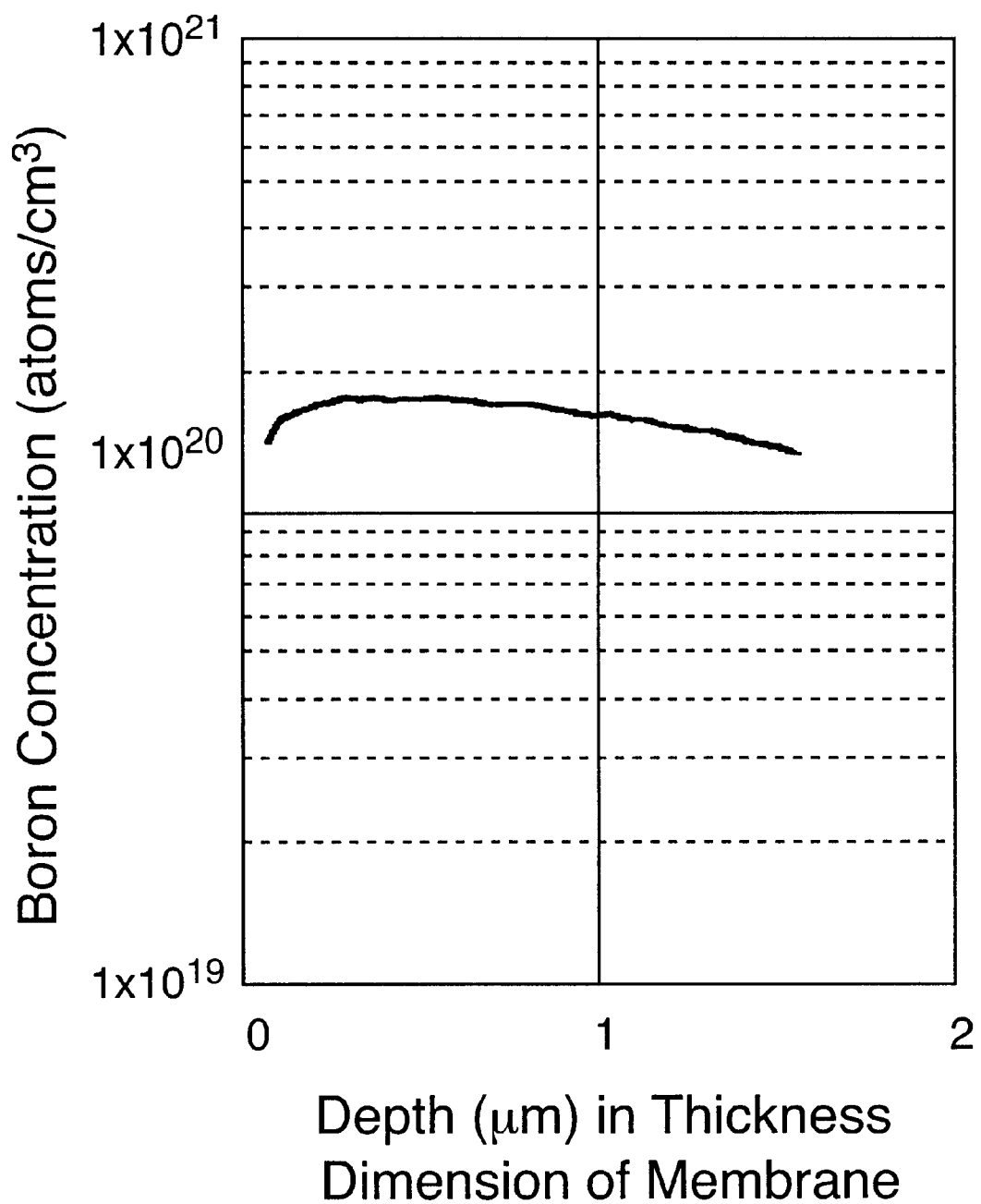
FIG. 8 is a graph of boron concentration, as a function of depth in the thickness dimension, in a membrane of a reticle blank fabricated using a conventional method.

FIG. 4 shows a plot 59 of the distribution of oxygen concentration in the membrane of the first reticle blank (fabricated by a method according to this embodiment), and a plot 60 of the second reticle blank (annealed without a protective nitride film). These plots indicate that, whenever a protective nitride film is applied before annealing, the concentration of oxygen in most of the thickness dimension of the membrane is approximately $1 \times 10^{17}$ atoms/cm$^3$, representing essentially no oxygen contamination of the membrane. In contrast, whenever annealing is performed in the absence of a protective nitride film, a relatively large amount ($1 \times 10^{18}$ to $1 \times 10^{23}$ atoms/cm$^3$) of oxygen contamination is distributed through the thickness dimension of the membrane.

Oxygen contamination of the membrane changes the nature of the stress from that of tensile stress to a compressive stress (i.e., relaxation of the membrane). As a result, the reticle membrane is stressed to a level exceeding practical limits for a microlithography reticle, and thus cannot be used.

Figure 3G:
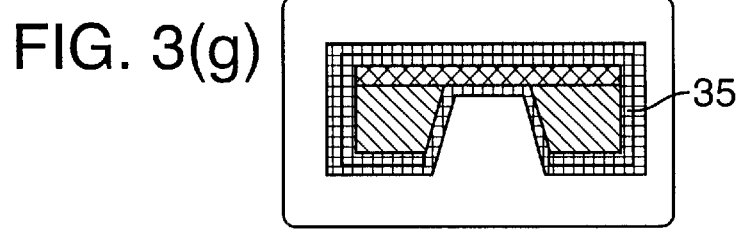
Figure 3H:
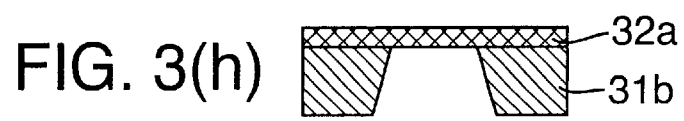

In a second representative embodiment of a method according to the invention for manufacturing a reticle blank, all but the last three steps are the same as corresponding steps in the method according to the first representative embodiment. I.e., in the second representative embodiment, the steps of the first representative embodiment shown in FIGS. 3(f)–3(h) are replaced by the steps shown in FIGS. 5(f)–5(j). The steps shown in FIGS. 5(a)–5(e) are identical to the steps shown in FIGS. 3(a)–3(e), respectively.

In the step of the second representative embodiment shown in FIG. 5(f), a protective resist 48 is applied to exposed portions of the silicon membrane 42 to protect the silicon membrane from etching after the silicon nitride film 45 is removed. (The resist 48 forms a convex profile as shown because a spin coater or the like is not used.) The silicon nitride film 45 is removed (FIG. 5(g)), followed by removal of the resist 48.

Next, a protective film 49 of silicon nitride is grown on or otherwise applied to the entire surface of the reticle blank (FIG. 5(h)). (If the silicon nitride film 45 had not been removed beforehand, then the thickness of the new film 49 of silicon nitride on the silicon membrane 42 would be different from the thickness of the silicon nitride film 45, 49 on the strut 41b. This could result in etching of the silicon membrane 42 when the silicon nitride film 45, 49 is removed in a later step (FIG. 5(j)).

It is noted that, instead of silicon nitride, a film of metal, silicon oxide, or SiON could be used.

An annealing step is performed in an annealing oven 47 (FIG. 5(i)). In the last step (FIG. 5(j)), the protective nitride film is removed by, e.g., dry-etching or by wet-etching with hot phosphoric acid.

As described above, a reticle blank made according to the invention comprises a reticle membrane in which the boron concentration is at a prescribed level. The variance distribution of the boron concentration through the thickness dimension of the reticle membrane is within 1%, and the reticle membrane desirably has essentially no oxygen contamination. These values of the stated parameters allow effective reduction of tensile stress in the thickness dimension of the reticle membrane, and prevention of distortion of the reticle membrane. A pattern defined on such a reticle membrane can be transferred to a sensitive substrate by CPB microlithography without experiencing any significant distortion of the pattern.

Whereas the invention has been described in connection with several representative embodiments, it will be understood that the invention is not limited to those embodiments. On the contrary, the invention is intended to encompass all modifications, alternatives, and equivalents as may be included within the spirit and scope of the claims, as defined by the appended claims.

What is claimed is:

1. A method for manufacturing a reticle blank, comprising:
   (a) providing a silicon substrate comprising an active silicon layer on a major surface of a silicon support portion;
   (b) at least on the silicon support portion, forming a wet-etching mask defining a prescribed pattern of openings corresponding to a desired pattern of windows;
   (c) wet-etching the silicon support portion, exposed in the openings, depthwise toward the active silicon layer;
   (d) forming a protective film of an oxygen-impermeable material over the wet-etched product of step (c); and
   (e) annealing the product of step (d); and
   (f) removing the protective film.

2. The method of claim 1, further comprising the step, between steps (c) and (d), of removing the wet-etching mask.

3. The method of claim 1, wherein step (f) further comprises removing the wet-etching mask.

4. The method of claim 1, wherein, in step (a), the active silicon is doped with boron to a concentration of $2 \times 10^{19}$ to $5 \times 10^{20}$ atoms/cm$^3$.

5. The method of claim 4, wherein the concentration of boron through the thickness dimension has a variance of no greater than 1%.

6. The method of claim 1, wherein step (e) is performed at a temperature of 1050 C. for three hours.

7. The method of claim 1, wherein step (d) comprises forming a layer of silicon nitride.

8. The method of claim 1, wherein, in step (b), the pattern of windows corresponds to an anticipated pattern of reticle subfields separated from one another by struts formed from remaining substrate.

9. A method for manufacturing a reticle for charged-particle-beam microlithography, comprising:
   (a) providing a reticle blank as recited in claim 1; and
   (b) defining a pattern in or on the active silicon layer.

10. A reticle blank manufactured by the method of claim 1.

11. A method for manufacturing a reticle blank, comprising:
   (a) providing a silicon substrate comprising an active silicon layer on a major surface of a silicon support portion;
   (b) at least on the silicon support portion, forming a wet-etching mask defining a prescribed pattern of openings corresponding to a desired pattern of windows;
   (c) wet-etching the silicon support portion, exposed in the openings, depthwise toward the active silicon layer to expose corresponding portions of the active silicon layer;
   (d) applying a protective resist to the exposed portions of the active silicon layer;
   (e) removing the wet-etching mask;
   (f) removing the protective resist;
   (g) forming a protective film of an oxygen-impermeable material over the product of step (f);
   (h) annealing the product of step (g); and
   (i) removing the protective film.

12. The method of claim 11, wherein, in step (a), the active silicon is doped with boron to a concentration of $2 \times 10^{19}$ to $5 \times 10^{20}$ atoms/cm$^3$.

13. The method of claim 12, wherein the concentration of boron through the thickness dimension has a variance of no greater than 1%.

14. The method of claim 11, wherein step (h) is performed at a temperature of 1050 C. for three hours.

15. The method of claim 11, wherein step (g) comprises forming a layer of silicon nitride.

16. The method of claim 11, wherein, in step (b), the pattern of windows corresponds to an anticipated pattern of reticle subfields separated from one another by struts formed from remaining substrate.

17. A method for manufacturing a reticle for charged-particle-beam microlithography, comprising:
   (a) providing a reticle blank as recited in claim 11; and
   (b) defining a pattern in or on the active silicon layer.

18. A reticle manufactured by the method of claim 17.

19. A reticle blank manufactured by the method of claim 11.

20. A reticle manufactured by the method of claim 9.

* * * * *